(12) United States Patent
Bathan et al.

(10) Patent No.: US 8,236,607 B2
(45) Date of Patent: Aug. 7, 2012

(54) INTEGRATED CIRCUIT PACKAGING SYSTEM WITH STACKED INTEGRATED CIRCUIT AND METHOD OF MANUFACTURE THEREOF

(75) Inventors: Henry Descalzo Bathan, Singapore (SG); Zigmund Ramirez Camacho, Singapore (SG); Jairus Legaspi Pisigan, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 191 days.

(21) Appl. No.: 12/488,383

(22) Filed: Jun. 19, 2009

(65) Prior Publication Data
US 2010/0320586 A1    Dec. 23, 2010

(51) Int. Cl.
*H01L 21/50* (2006.01)
*H01L 21/48* (2006.01)
*H01L 21/44* (2006.01)
*H01L 23/02* (2006.01)
*H01L 23/52* (2006.01)
*H01L 23/498* (2006.01)
*H01L 23/538* (2006.01)

(52) U.S. Cl. ........ 438/109; 438/106; 257/686; 257/777; 257/E23.068; 257/E23.169

(58) Field of Classification Search .................. 438/106, 438/109; 257/686, 777, E23.068, E23.169
See application file for complete search history.

(56) References Cited

U.S. PATENT DOCUMENTS

| | | | |
|---|---|---|---|
| 6,664,644 B2* | 12/2003 | Morozumi | 257/777 |
| 6,689,640 B1* | 2/2004 | Mostafazadeh | 438/121 |
| 6,815,254 B2* | 11/2004 | Mistry et al. | 438/108 |
| 6,849,952 B2* | 2/2005 | Ishimura et al. | 257/777 |
| 7,312,529 B2 | 12/2007 | Clevenger et al. | |
| 7,495,319 B2* | 2/2009 | Fukuda et al. | 257/666 |
| 7,535,110 B2 | 5/2009 | Wu et al. | |
| 7,645,640 B2* | 1/2010 | Lee et al. | 438/124 |
| 7,906,852 B2* | 3/2011 | Nishimura et al. | 257/777 |
| 2004/0262774 A1* | 12/2004 | Kang et al. | 257/777 |
| 2007/0252255 A1 | 11/2007 | Lam | |
| 2008/0067649 A1* | 3/2008 | Matsunaga et al. | 257/677 |
| 2008/0111222 A1* | 5/2008 | Sheridan et al. | 257/678 |
| 2008/0150157 A1 | 6/2008 | Nishimura et al. | |
| 2008/0308933 A1* | 12/2008 | Tay et al. | 257/738 |
| 2010/0244212 A1* | 9/2010 | Ha et al. | 257/676 |

* cited by examiner

*Primary Examiner* — Luan C Thai
(74) *Attorney, Agent, or Firm* — Ishimaru & Associates LLP; Mikio Ishimaru; Stanley M. Chang

(57) ABSTRACT

A method of manufacture an integrated circuit packaging system includes: providing a substrate; attaching a base component to the substrate by a first interconnect; attaching a stack component connected by a second interconnect to the substrate and partially over the base component, the second interconnect different from the first interconnect; molding an encapsulation over the base component, the first interconnect, the stack component, and the second interconnect; and removing the substrate to partially expose the first interconnect and the second interconnect from the encapsulation.

20 Claims, 5 Drawing Sheets

INTEGRATED CIRCUIT PACKAGING SYSTEM WITH STACKED INTEGRATED CIRCUIT AND METHOD OF MANUFACTURE THEREOF

TECHNICAL FIELD

The present invention relates generally to an integrated circuit packaging system, and more particularly to a system for an integrated circuit packaging system with a stacked integrated circuit.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for performance, integration, and cost reduction.

Thus, a need still remains for an integrated circuit packaging system providing improved chip interconnection, space savings and low cost manufacturing. In view of the ever-increasing need to improve performance, integration, and cost reduction, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a substrate; attaching a base component to the substrate by a first interconnect; attaching a stack component connected by a second interconnect to the substrate and partially over the base component, the second interconnect different from the first interconnect; molding an encapsulation over the base component, the first interconnect, the stack component, and the second interconnect; and removing the substrate to partially expose the first interconnect and the second interconnect from the encapsulation.

The present invention provides an integrated circuit packaging system, including: a base component; a first interconnect attached to the base component; a second interconnect different from the first interconnect and adjacent to the base component; a stack component partially over the base component and connected to the second interconnect; and an encapsulation over the base component, the first interconnect, the stack component, and the second interconnect, the first interconnect and the second interconnect partially exposed from the encapsulation.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
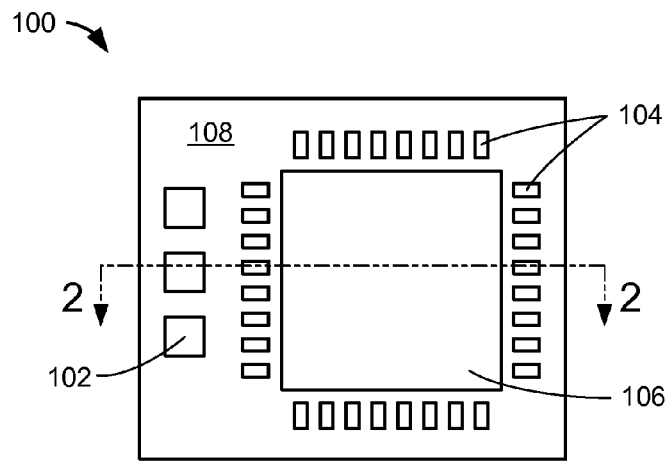
FIG. 1 is a bottom view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

Referring now to FIG. 1, therein is shown a bottom view of an integrated circuit packaging system 100 in a first embodiment of the present invention. The bottom view depicts a first external pad 102, which can include a bond pad, a pad, or a die attach pad (DAP).

The first external pad 102 can serve as land pad, capture pad, trace, lead, or any combination thereof for providing connectivity to external systems. The first external pad 102 can be connected by a conductive ball to a chip, a die, or a component that may be stacked.

The integrated circuit packaging system 100 can include a second external pad 104, which can include a bond pad, a pad, or a die attach pad (DAP). The second external pad 104 can have a dimension different than a dimension of the first external pad 102. The second external pad 104 can serve as land pad, capture pad, trace, lead, or any combination thereof for providing connectivity to external systems. The second external pad 104 can be connected to a chip, a die, or a component by an electrical wire.

The integrated circuit packaging system 100 can include a third external pad 106, which can include a bond pad, a pad, or a die attach pad (DAP). The third external pad 106 can have a dimension different than the dimensions of the first external pad 102 and the second external pad 104. The third external pad 106 can have a planar dimension for mounting a chip, a die, or a component.

The first external pad 102, the second external pad 104, and the third external pad 106 can include preferably gold-nickel-palladium (Au—Ni—Pd) or conductive material, such as gold (Au), nickel (Ni), palladium (Pd), silver (Ag), tin (Sn), chromium (Cr), titanium (Ti), any other metal, metal alloy, or a combination thereof. The bottom view depicts a bottom portion of an encapsulation 108, such as a cover, a mold cap, or a conformal cover, formed by material such dielectric or epoxy molding compound.

The integrated circuit packaging system 100 can have any number or configuration of the first external pad 102, the second external pad 104, and the third external pad 106. The first external pad 102, the second external pad 104, and the third external pad 106 can be formed with a variable size.

Figure 2:
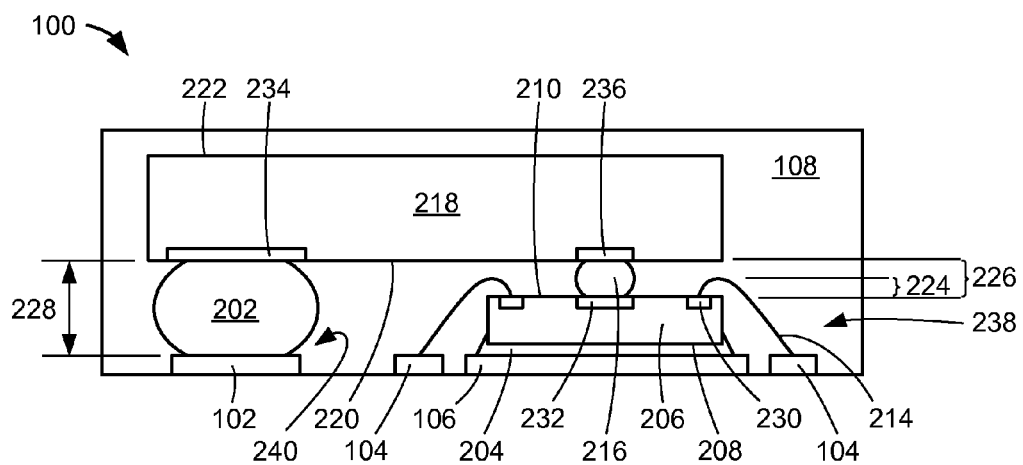
FIG. 2 is a cross-sectional view of the integrated circuit packaging system along a section line 2-2 of FIG. 1.

Referring now to FIG. 2, therein is shown a cross-sectional view of the integrated circuit packaging system 100 along a section line 2-2 of FIG. 1. The cross-sectional view depicts the first external pad 102, the second external pad 104, and the third external pad 106.

The integrated circuit packaging system 100 can include a chip-to-pad interconnect 202, such as a conductive ball, a solder ball, a solder bump, or an electrical interconnect, for providing connection between facing surfaces. The chip-to-pad interconnect 202 can be attached to or on the first external pad 102. The integrated circuit packaging system 100 can include a base attach layer 204, such as a conductive or non-conductive material, for attaching a component or a device over or on the third external pad 106.

The integrated circuit packaging system 100 can include a base component 206, such as a wirebond integrated circuit, a flipchip, a bare die, or a wafer level chip scale package (WLCSP). The base component 206 can include a base inactive side 208, such as a backside, mounted over the third external pad 106 with the base attach layer 204.

The base component 206 can include a base active side 210, such as an active side that includes active circuitry, over the base inactive side 208. The integrated circuit packaging system 100 can include an internal interconnect 214, such as a conductive wire or a bond wire, attaching the second external pad 104 and the base component 206 by connecting the second external pad 104 and the base component 206.

The integrated circuit packaging system 100 can include a chip-to-chip interconnect 216, such as a conductive ball, an interconnect, a solder ball, a solder bump, or an electrical interconnect. The chip-to-chip interconnect 216 can be attached to or on the base component 206. The chip-to-chip interconnect 216 can be different from the chip-to-pad interconnect 202 and the internal interconnect 214.

The integrated circuit packaging system 100 can include a stack component 218, such as a flipchip, a wafer level chip scale package (WLCSP), a wirebond integrated circuit, or a bare die. The stack component 218 can include a stack component active side 220, such as a side that includes active circuitry. The stack component 218 can include a stack component inactive side 222, such as a backside, over the stack component active side 220.

The stack component 218 can be mounted over the first external pad 102. The stack component 218 can be connected to the chip-to-pad interconnect 202 by attaching the stack component 218 to or on the chip-to-pad interconnect 202, the stack component 218 partially over the base component 206. The stack component 218 is shown having portions directly over the base component 206, the first external pad 102, the chip-to-pad interconnect 202, the second external pad 104, and the internal interconnect 214.

The chip-to-pad interconnect 202 can be attached to a surface of the stack component 218 facing the first external pad 102. The chip-to-pad interconnect 202 can attach the first external pad 102 and the stack component 218 by connecting the first external pad 102 and the stack component 218 for providing an electrical connection between the first external pad 102 and the stack component 218.

The stack component 218 can be mounted over the base component 206. The chip-to-chip interconnect 216 can be attached to the base component 206 and the stack component 218. The chip-to-chip interconnect 216 can attach the base component 206 and the stack component 218 by connecting the base component 206 and the stack component 218 for providing an electrical connection between the base component 206 and the stack component 218.

The number and position of the internal interconnect 214 attaching the second external pad 104 and the base component 206 can be customized depending on the application of the base component 206. Similarly, the number and position of the chip-to-pad interconnect 202 and the chip-to-chip interconnect 216 can be customized depending on the application of the base component 206, the stack component 218, or a combination thereof.

The cross-sectional view depicts the internal interconnect 214 attaching the second external pad 104 and the base component 206 shown as a bond wire with a loop height 224, which is defined as a distance from the base active side 210 to the top of the internal interconnect 214. The chip-to-chip interconnect 216 can have a chip-to-chip height 226 that provides space between the base component 206 and the stack component 218 for the internal interconnect 214. For example, the chip-to-chip height 226 can provide space above the base active side 210 for the loop height 224.

The loop height 224 can be smaller than the chip-to-chip height 226. With the loop height 224 being smaller than the chip-to-chip height 226, the internal interconnect 214 attaching the second external pad 104 and the base component 206 can be formed under the stack component 218, allowing the stack component 218 to be positioned entirely over the base component 206.

The chip-to-pad interconnect 202 can have a chip-to-pad height 228 that provides space above the third external pad 106 for stacking the base attach layer 204, the base component 206, and the internal interconnect 214 attached to the second external pad 104 and the base component 206. The chip-to-chip height 226 can be smaller than the chip-to-pad height 228.

A first base pad 230 and a second base pad 232, such as electrical contacts or bond pads, can be formed at the base active side 210. The internal interconnect 214 can attach the second external pad 104 and the base component 206 by connecting the second external pad 104 and the first base pad 230 of the base component 206. The chip-to-chip interconnect 216 can be attached to or on the second base pad 232 of the base component 206.

A stack pad 234 and a component pad 236 can be formed at the stack component active side 220. The chip-to-pad interconnect 202 can attach the first external pad 102 and the stack component 218 by connecting the first external pad 102 and the stack pad 234 of the stack component 218 for providing an electrical connection between the first external pad 102 and the stack component 218. The chip-to-chip interconnect 216 can attach the base component 206 and the stack component 218 by connecting the second base pad 232 of the base component 206 and the component pad 236 of the stack component 218 for providing an electrical connection between the base component 206 and the stack component 218.

The integrated circuit packaging system 100 can include the encapsulation 108 molded over the first external pad 102, the second external pad 104, the third external pad 106, the chip-to-pad interconnect 202, the base attach layer 204, the base component 206, the internal interconnect 214, the chip-to-chip interconnect 216, and the stack component 218. The first external pad 102, the second external pad 104, and the third external pad 106 can be partially exposed from the encapsulation 108 and coplanar with a plane formed by a bottom of the encapsulation 108.

For example, a first interconnect 238 can include the internal interconnect 214 and can optionally include the second external pad 104 having only a bottom side exposed from the encapsulation 108. The first interconnect 238 can be attached to the base component 206 and on a base layer, a substrate, or another component in a system. Similarly, a second interconnect 240 can include the chip-to-pad interconnect 202 and can optionally include the first external pad 102 having only a bottom side exposed from the encapsulation. The second interconnect 240 can be attached to the stack component 218 and on a base layer, a substrate, or another component in a system. The first interconnect 238 and the second interconnect 240, preferably different from the first interconnect 238, can be partially exposed from the encapsulation 108. The first interconnect 238 including the internal interconnect 214, the second external pad 104, or a combination thereof can be attached immediately adjacent to the base component 206. The second interconnect 240 including the chip-to-pad interconnect 202, the first external pad 102, or a combination thereof can be attached immediately adjacent to the first interconnect 238 on a side opposite to the base component 206. The first interconnect 238 can be located between the second interconnect 240 and the base component 206.

It has been discovered that the integrated circuit packaging system 100 provides improved performance. The present invention can provide improved connection between the base component 206, the stack component 218, and external systems such as printed circuit boards (PCB), packages, and thin films. Comparing to conventional leadframe-based packages, the present invention can provide improved chip interconnection without the need for a substrate, the presence of which can incur additional propagation delay through traces, pads, and vias, as examples.

It has also been discovered that the integrated circuit packaging system 100 provides improved integration. The present invention can provide the first external pad 102 and the second external pad 104 for connecting to external systems, the first external pad 102 and the second external pad 104 provided as input/output pads for the base component 206 and the stack component 218. The present invention can support many input/output pads without the difficulty that can arise in flipchip and wirebond integrated circuit integration of conventional leadframe-based packages. The difficulty can include input/output pad limited and processability issues related to coplanarity with thin leadframe and increasingly fine pad pitch packages. The present invention can also provide integration with a large number of input/output pads without increasing the package's area.

It has further been discovered that the present invention provides the integrated circuit packaging system 100 providing cost reduction. The present invention can provide cost reduction in providing improved chip interconnection without requiring the substrate. The present invention can provide a simple integration of the base component 206 and the stack component 218, reducing manufacturing cost for supporting input/output pads without tie bars and dam bars comparing to conventional leadframe-based packages.

Figure 3:
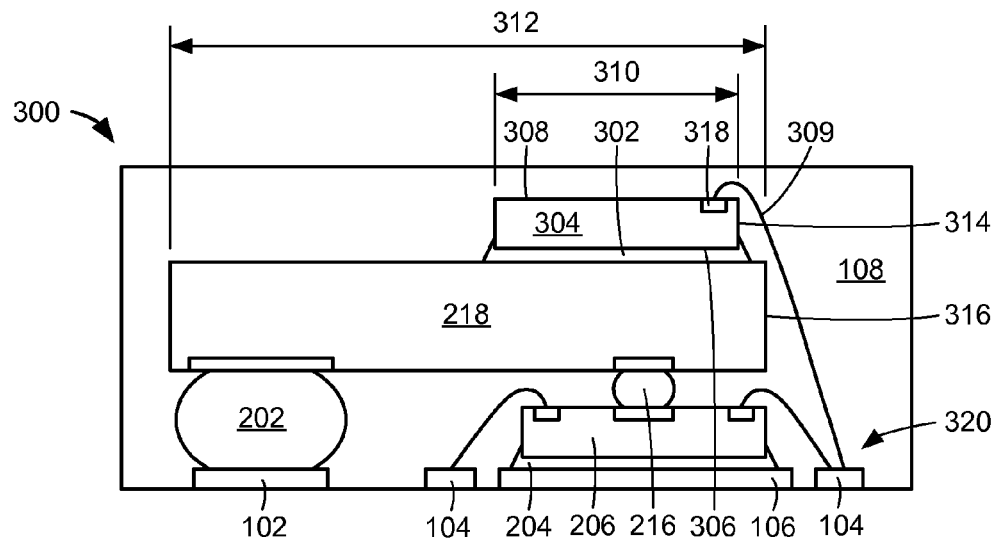
FIG. 3 is a cross-sectional view similar to FIG. 2 of an integrated circuit packaging system in a second embodiment of the present invention.

Referring now to FIG. 3, therein is shown a cross-sectional view similar to FIG. 2 of an integrated circuit packaging system 300 in a second embodiment of the present invention. The cross-sectional view depicts a stack attach layer 302, such as a die attach, a die attach adhesive, a conductive epoxy, a non-conductive die attach, an adhesive, a B-stage adhesive, an epoxy, a tape, an underfill, an acrylic resin, or an epoxy resin. The stack attach layer 302 can be attached over the stack component 218.

The integrated circuit packaging system 300 can include a second stack component 304, such as a stack component, a wirebond integrated circuit, a flipchip, a bare die, or a wafer level chip scale package (WLCSP). The second stack component 304 can be the same or different technology as the base component 206 and the stack component 218. The second stack component 304 can include a second stack component inactive side 306, such as a backside, mounted over the stack attach layer 302.

The second stack component 304 can be attached over the stack component 218 with the stack attach layer 302 in between, the second stack component 304 of a different thickness from the stack component 218. The integrated circuit packaging system 300 can provide a center of the second stack component 304 offset from a center of the stack component 218.

The second stack component 304 can include a second stack component active side 308, such as an active side that includes active circuitry, over the second stack component inactive side 306. The integrated circuit packaging system 300 can attach a second internal interconnect 309, such as an interconnect, a bond wire, or a conductive wire, to the second external pad 104 and the second stack component 304 by connecting the second external pad 104 and the second stack component 304 for providing an electrical connection between the second external pad 104 and the second stack component 304. The second stack component 304 can be connected only at one end by the second internal interconnect 309 to the second external pad 104.

The second stack component 304 can have a different size from the stack component 218. The second stack component 304 can have a second stack planar dimension 310 smaller than a stack planar dimension 312 of the stack component 218. The second stack component 304 can optionally have a second stack vertical side 314 near a stack vertical side 316 of the stack component 218.

Having the second stack vertical side 314 near the stack vertical side 316 can provide a shorter path for the second internal interconnect 309 having a significantly lower loop height. Having the second stack vertical side 314 near the stack vertical side 316 can also provide the second internal interconnect 309 from contacting with the stack vertical side 316.

A stack internal pad 318 can be formed at the second stack component active side 308. The integrated circuit packaging system 300 can attach the second internal interconnect 309 to the second external pad 104 and the second stack component 304 by connecting the second external pad 104 and the stack internal pad 318 of the second stack component 304 for providing an electrical connection between the second external pad 104 and the second stack component 304.

The integrated circuit packaging system 300 can include the encapsulation 108 molded over the first external pad 102, the second external pad 104, the third external pad 106, the chip-to-pad interconnect 202, the base attach layer 204, the base component 206, the internal interconnect 214, the chip-to-chip interconnect 216, the stack component 218, the stack attach layer 302, the second stack component 304, and the second internal interconnect 309. The first external pad 102, the second external pad 104, and the third external pad 106 can be partially exposed from the encapsulation 108 and coplanar with a plane formed by a bottom of the encapsulation 108.

For example, an interconnect 320 can include the second internal interconnect 309 and can optionally include the second external pad 104. The interconnect 320 can be attached to the second stack component 304 and on a base layer, a substrate, or another component in a system. The interconnect 320 can be partially exposed from the encapsulation 108.

Figure 4:
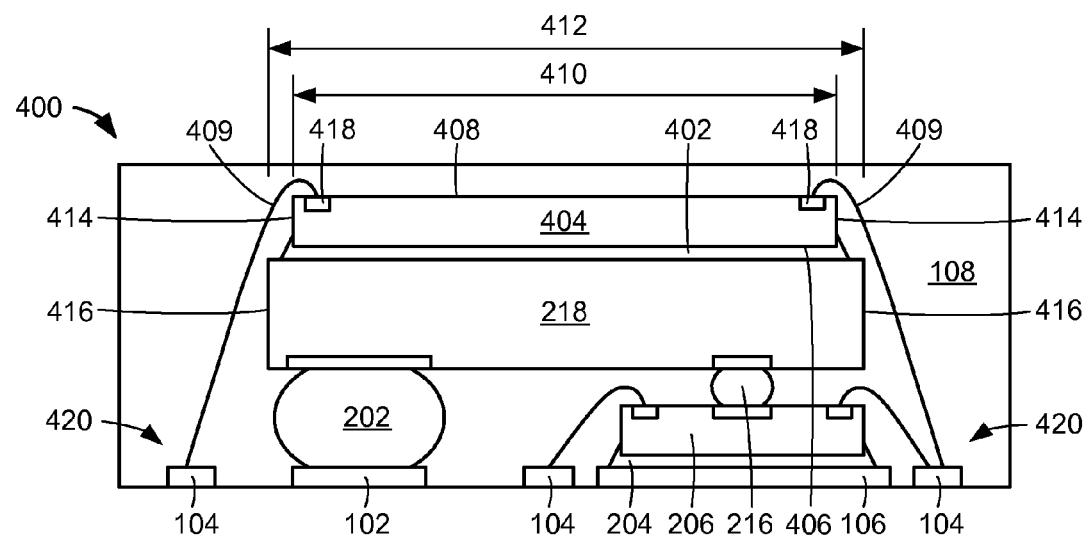
FIG. 4 is a cross-sectional view similar to FIG. 2 of an integrated circuit packaging system in a third embodiment of the present invention.

Referring now to FIG. 4, therein is shown a cross-sectional view similar to FIG. 2 of an integrated circuit packaging system 400 in a third embodiment of the present invention. The cross-sectional view depicts a stack attach layer 402, such as a die attach, a die attach adhesive, a conductive epoxy, a non-conductive die attach, an adhesive, a B-stage adhesive, an epoxy, a tape, an underfill, an acrylic resin, or an epoxy resin. The stack attach layer 402 can be attached over the stack component 218.

The integrated circuit packaging system 400 can include a second stack component 404, such as a stack component, a wirebond integrated circuit, a flipchip, a bare die, or a wafer level chip scale package (WLCSP). The second stack component 404 can be the same or different technology as the base component 206 and the stack component 218. The second stack component 404 can include a second stack component inactive side 406, such as a backside, mounted over the stack attach layer 402.

The second stack component 404 can be attached over the stack component 218 with the stack attach layer 402 in between, the second stack component 404 of a different thickness from the stack component 218. The integrated circuit packaging system 400 can provide the second stack component 404 substantially centered over the stack component 218.

The second stack component 404 can include a second stack component active side 408, such as an active side that includes active circuitry, over the second stack component inactive side 406. The integrated circuit packaging system 400 can attach a second internal interconnect 409, such as an interconnect, a bond wire, or a conductive wire, to the second external pad 104 and the second stack component 404 by connecting the second external pad 104 and the second stack component 404 for providing an electrical connection between the second external pad 104 and the second stack component 404. The second stack component 404 can be connected at each end of the second stack component 404 by the second internal interconnect 409 to the second external pad 104.

The second stack component 404 can have a similar size to the stack component 218. The second stack component 404 can have a second stack planar dimension 410 similar to a stack planar dimension 412 of the stack component 218. The second stack component 404 can optionally have a second stack vertical side 414 near a stack vertical side 416 of the stack component 218.

Having the second stack vertical side 414 near the stack vertical side 416 can provide a shorter path for the second internal interconnect 409 having a significantly lower loop height. Having the second stack vertical side 414 near the stack vertical side 416 can also provide the second internal interconnect 409 from contacting with the stack vertical side 416.

A stack internal pad 418 can be formed at the second stack component active side 408. The integrated circuit packaging system 400 can attach the second internal interconnect 409 to the second external pad 104 and the second stack component 404 by connecting the second external pad 104 and the stack internal pad 418 of the second stack component 404 for providing an electrical connection between the second external pad 104 and the second stack component 404.

The integrated circuit packaging system 400 can include the encapsulation 108 molded over the first external pad 102, the second external pad 104, the third external pad 106, the chip-to-pad interconnect 202, the base attach layer 204, the base component 206, the internal interconnect 214, the chip-to-chip interconnect 216, the stack component 218, the stack attach layer 402, the second stack component 404, and the second internal interconnect 409. The first external pad 102, the second external pad 104, and the third external pad 106 can be partially exposed from the encapsulation 108 and coplanar with a plane formed by a bottom of the encapsulation 108.

For example, an interconnect 420 can include the second internal interconnect 409 and can optionally include the second external pad 104. The interconnect 420 can be attached to the second stack component 404 and on a base layer, a substrate, or another component in a system. The interconnect 420 can be partially exposed from the encapsulation 108.

Figure 5:
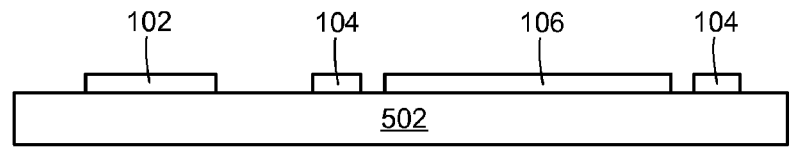
FIG. 5 is a cross-sectional view of the integrated circuit packaging system along the section line 2-2 of FIG. 1 in an assembly process of a providing phase of a substrate.

Referring now to FIG. 5, therein is shown a cross-sectional view of the integrated circuit packaging system 100 along the section line 2-2 of FIG. 1 in an assembly process of a providing phase of a substrate 502. For example, the substrate 502 can be provided as a sheet in a strip of preferably formed of copper, although any metal or metal alloy can be used.

The cross-sectional view depicts the first external pad 102, the second external pad 104, and the third external pad 106 provided on the substrate 502. The first external pad 102, the second external pad 104, and the third external pad 106 can be formed on the substrate 502 by plating process.

The first external pad 102 and the second external pad 104 can serve as land pad, capture pad, trace, lead, or any combination thereof for providing connectivity to external systems. The first external pad 102, the second external pad 104, and the third external pad 106 can include preferably gold-nickel-palladium (Au—Ni—Pd) or conductive material, such as gold (Au), nickel (Ni), palladium (Pd), silver (Ag), tin (Sn), chromium (Cr), titanium (Ti), any other metal, metal alloy, or a combination thereof.

Figure 6:
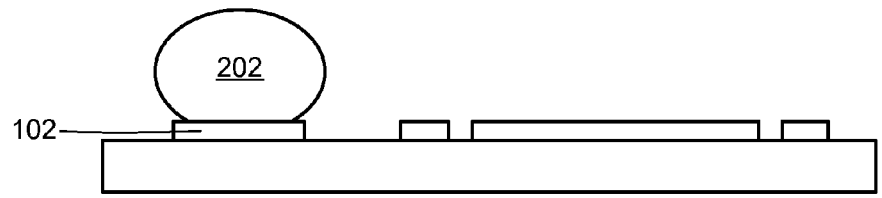
FIG. 6 is a cross-sectional view of the structure of FIG. 5 in an attaching phase of the chip-to-pad interconnect.

Referring now to FIG. 6, therein is shown a cross-sectional view of the structure of FIG. 5 in an attaching phase of the chip-to-pad interconnect 202. The cross-sectional view depicts the chip-to-pad interconnect 202 attached to or on the first external pad 102.

The chip-to-pad interconnect 202 can provide connection between facing surfaces. For example, the chip-to-pad interconnect 202 can be a solder ball, a solder bump, or an electrical interconnect.

Figure 7:
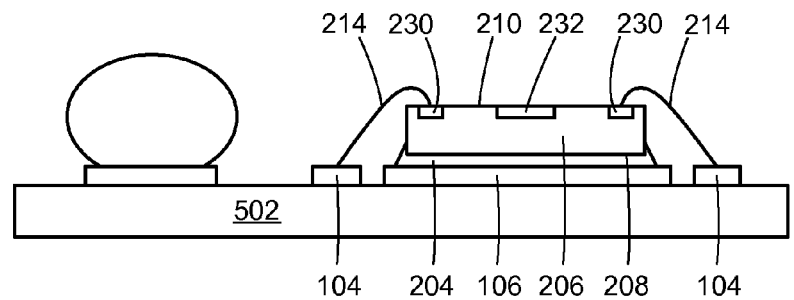
FIG. 7 is a cross-sectional view of the structure of FIG. 6 in a mounting phase of the base integrated circuit.

Referring now to FIG. 7, therein is shown a cross-sectional view of the structure of FIG. 6 in a mounting phase of the base component 206. The base component 206 can be attached over the substrate 502. The cross-sectional view depicts the base attach layer 204 for attaching the base component 206 over or on the third external pad 106.

The cross-sectional view depicts the base component 206 having the base inactive side 208 mounted over the third external pad 106 with the base attach layer 204. The base component 206 can include the base active side 210 over the base inactive side 208.

The first base pad 230 and the second base pad 232 can be formed at the base active side 210. The base component 206 can be attached to the second external pad 104 on the substrate 502 by connecting the internal interconnect 214 between the base component 206 and the second external pad 104.

The cross-sectional view depicts the internal interconnect 214 attaching the second external pad 104 and the base component 206. The number and position of the internal interconnect 214 attaching the second external pad 104 and the base component 206 can be customized depending on the application of the base component 206.

Figure 8:
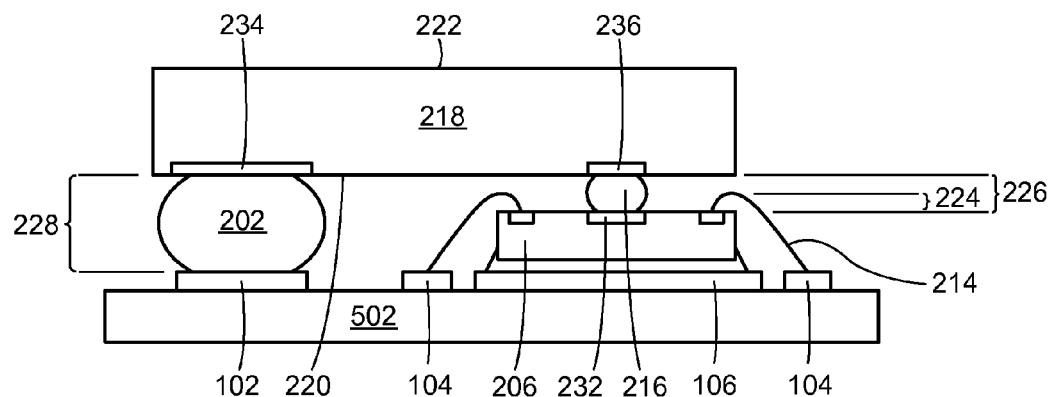
FIG. 8 is a cross-sectional view of the structure of FIG. 7 in a mounting phase of the stack component.

Referring now to FIG. 8, therein is shown a cross-sectional view of the structure of FIG. 7 in a mounting phase of the stack component 218. The cross-sectional view depicts the chip-to-chip interconnect 216 attached to or on the second base pad 232 of the base component 206.

The cross-sectional view depicts the stack component 218. The stack component 218 can include the stack component active side 220. The stack pad 234 and the component pad 236 can be formed at the stack component active side 220. The stack component 218 can include the stack component inactive side 222 over the stack component active side 220.

The stack component 218 can be attached to the substrate 502 by connecting the chip-to-pad interconnect 202 to the stack component 218 and the first external pad 102 on the substrate 502. The stack component 218 can be partially over the base component 206. The chip-to-pad interconnect 202 can be different from the internal interconnect 214.

The stack component 218 can be mounted over the first external pad 102. The stack component 218 can be attached to or on the chip-to-pad interconnect 202.

The chip-to-pad interconnect 202 can be attached to a surface of the stack component 218 facing the first external pad 102. The chip-to-pad interconnect 202 can attach the first external pad 102 and the stack component 218 for providing an electrical connection between the first external pad 102 and the stack component 218.

The stack component 218 can be mounted over the base component 206. The chip-to-chip interconnect 216 can be attached to the base component 206 and the stack component 218. The chip-to-chip interconnect 216 can attach the base component 206 and the stack component 218 for providing an electrical connection between the base component 206 and the stack component 218.

The number and position of the chip-to-pad interconnect 202 and the chip-to-chip interconnect 216 can be customized depending on the application of the base component 206, the stack component 218, or a combination thereof. The cross-sectional view depicts the internal interconnect 214 attaching the second external pad 104 and the base component 206 shown as a bond wire with the loop height 224.

The chip-to-chip interconnect 216 can have the chip-to-chip height 226. For example, the chip-to-chip height 226 can provide space above the base active side 210 for the loop height 224.

The loop height 224 can be smaller than the chip-to-chip height 226. With the loop height 224 being smaller than the chip-to-chip height 226, the internal interconnect 214 attaching the second external pad 104 and the base component 206 can be formed under the stack component 218, allowing the stack component 218 to be positioned entirely over the base component 206.

The chip-to-pad interconnect 202 can have the chip-to-pad height 228. The chip-to-chip height 226 can be smaller than the chip-to-pad height 228.

Figure 9:
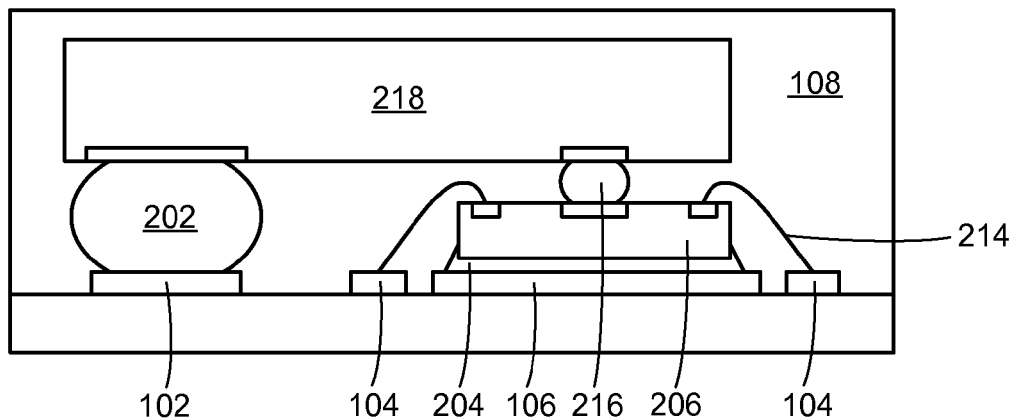
FIG. 9 is a cross-sectional view of the structure of FIG. 8 in a molding phase of the encapsulation.

Referring now to FIG. 9, therein is shown a cross-sectional view of the structure of FIG. 8 in a molding phase of the encapsulation 108. The cross-sectional view depicts the encapsulation 108 molded over the first external pad 102, the second external pad 104, the third external pad 106, the chip-to-pad interconnect 202, the base attach layer 204, the base component 206, the internal interconnect 214, the chip-to-chip interconnect 216, and the stack component 218.

Figure 10:
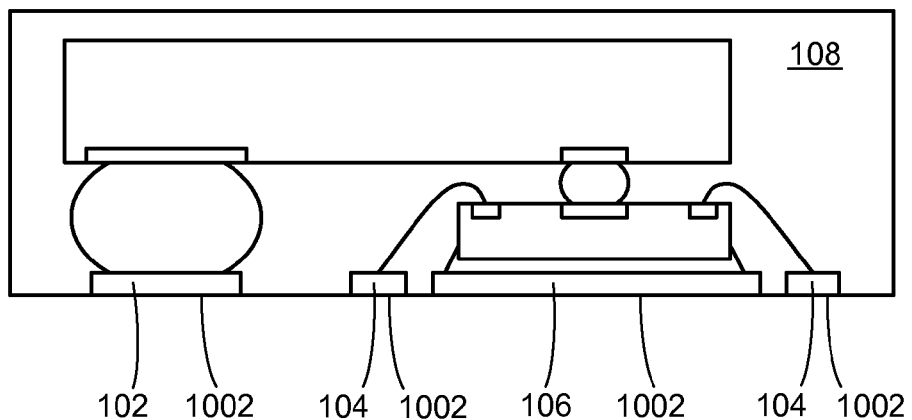
FIG. 10 is a cross-sectional view of the structure of FIG. 9 in a removal phase of the substrate.

Referring now to FIG. 10, therein is shown a cross-sectional view of the structure of FIG. 9 in a removal phase of the substrate 502 of FIG. 5. The removal phase of the substrate 502 of FIG. 5 can be done by etching. Besides etching, other means such as grinding, sanding, or any other mechanical or chemical means, can remove the substrate 502 of FIG. 5.

The first external pad 102, the second external pad 104, and the third external pad 106 can include an external surface 1002 having characteristics of the substrate 502 of FIG. 5 removed. The external surface 1002 can include characteristics such as an etched surface, grinding marks, sanding marks, other removal tool marks, chemical residue, or a chemically processed surface.

After the substrate 502 of FIG. 5 is removed, the first external pad 102, the second external pad 104, and the third external pad 106 can be partially exposed from the encapsulation 108 and coplanar with a plane formed by a bottom of the encapsulation 108. After the removal phase, singulation can be performed by mechanical or optical means, such as cutting, sawing, or laser scribing, to produce individual package units.

Figure 11:
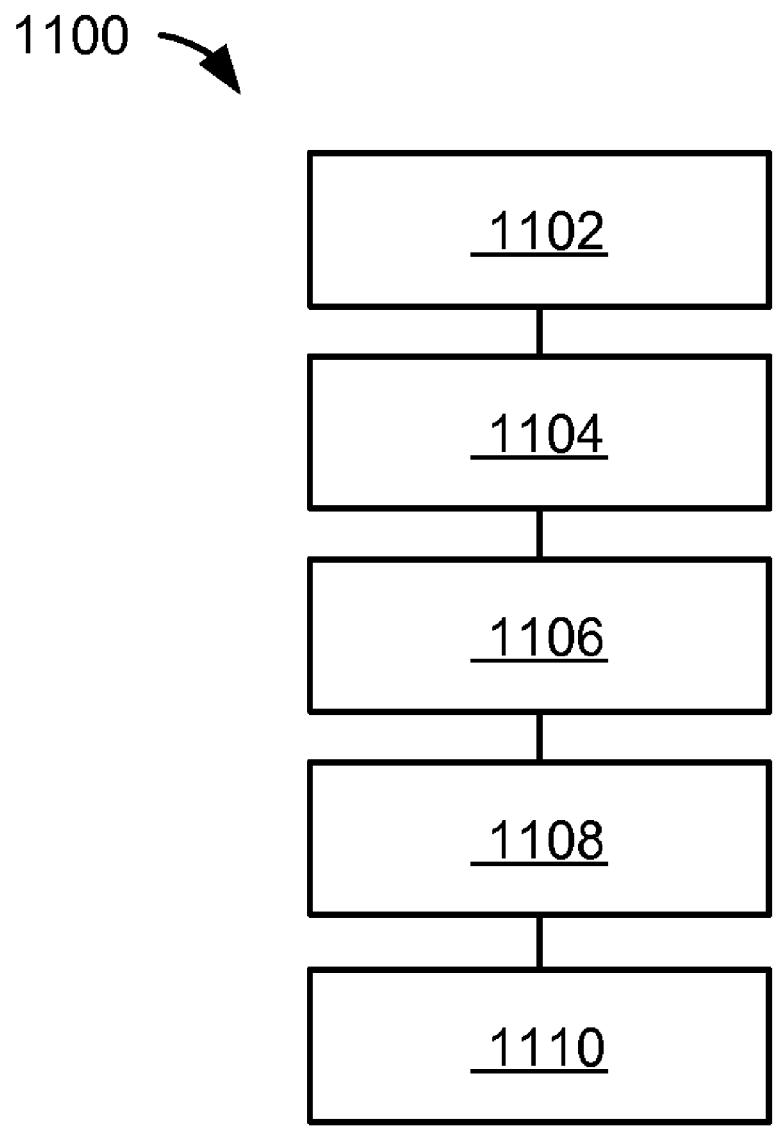
FIG. 11 is a flow chart of a method of manufacture of an integrated circuit packaging system in a further embodiment of the present invention.

Referring now to FIG. 11, therein is shown a flow chart of a method 1100 of manufacture of an integrated circuit packaging system in a further embodiment of the present invention. The method 1100 includes: providing a substrate in a block 1102; attaching a base component to the substrate by a first interconnect in a block 1104; attaching a stack component connected by a second interconnect to the substrate and partially over the base component, the second interconnect different from the first interconnect in a block 1106; molding an encapsulation over the base component, the first interconnect, the stack component, and the second interconnect in a block 1108; and removing the substrate to partially expose the first interconnect and the second interconnect from the encapsulation in a block 1110.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a substrate;
   attaching a base component to the substrate by a first interconnect;
   attaching a second interconnect to the substrate adjacent to the base component, with the first interconnect between the second interconnect and the base component;
   attaching a stack component connected by a second interconnect to the substrate and directly over the base component, the first interconnect, and the second interconnect;
   molding an encapsulation over the base component, the first interconnect, the stack component, and the second interconnect; and
   removing the substrate to partially expose the first interconnect and the second interconnect from the encapsulation.

2. The method as claimed in claim 1 further comprising connecting the base component and the stack component with a third interconnect different from the first interconnect.

3. The method as claimed in claim 1 further comprising attaching a further stack component over the stack component.

4. The method as claimed in claim 1 further comprising attaching a further stack component over the stack component, the further stack component connected by a further interconnect to the substrate.

5. The method as claimed in claim 1 further comprising attaching a further stack component over the stack component, the further stack component of a different size from the stack component.

6. A method of manufacture of an integrated circuit packaging system comprising:
   providing a substrate;
   forming a first bond pad and a second bond pad on the substrate;
   connecting a first conductive ball on the first bond pad;
   attaching a base component over the substrate with the second bond pad between the base component and the first bond pad;
   connecting a first conductive wire between the base component and the second bond pad;
   connecting a stack component to the first conductive ball and directly over the first interconnect, the second interconnect, and the base component;
   molding an encapsulation over the base component, the first conductive ball, the first bond pad, the stack component, the first conductive wire, and the second bond pad; and
   removing the substrate to partially expose the first bond pad and the second bond pad from the encapsulation.

7. The method as claimed in claim 6 further comprising connecting the base component and the stack component with a second conductive ball different from the first conductive ball.

8. The method as claimed in claim 6 further comprising attaching a further stack component over the stack component, the further stack component connected by conductive wires at each end of the further stack component to the substrate.

9. The method as claimed in claim 6 further comprising attaching a further stack component over the stack component, the further stack component connected only at one end by a conductive wire to the substrate.

10. The method as claimed in claim 6 further comprising a further stack component over the stack component, the further stack component of a different thickness from the stack component.

11. An integrated circuit packaging system comprising:
   a base component;
   a first interconnect attached to the base component;
   a second interconnect adjacent to the base component, with the first interconnect between the second interconnect and the base component;
   a stack component directly over the base component, the first interconnect, and the second interconnect, and connected to the second interconnect; and an encapsulation over the base component, the first interconnect, the stack component, and the second interconnect, with the first interconnect and the second interconnect partially exposed from the encapsulation.

12. The system as claimed in claim 11 further comprising a third interconnect connected to the base component and the stack component, the third interconnect different from the first interconnect.

13. The system as claimed in claim 11 further comprising a further stack component over the stack component.

14. The system as claimed in claim 11 further comprising:
a further stack component over the stack component; and
a further interconnect connected to the further stack component.

15. The system as claimed in claim 11 further comprising a further stack component over the stack component, the further stack component of a different size from the stack component.

16. The system as claimed in claim 11 further comprising:
a first bond pad;
a second bond pad adjacent to the first bond pad with the second bond pad between the first bond pad and the base component;
a first conductive ball on the first bond pad and connected to the stack component;

wherein:
the first interconnect includes a first conductive wire and the second bond pad; and
the encapsulation is over the first conductive ball, the first bond pad, the first conductive wire, and the second bond pad, the first bond pad and the second bond pad partially exposed from the encapsulation.

17. The system as claimed in claim 16 further comprising a second conductive ball connected to the base component and the stack component, the second conductive ball different from the first conductive ball.

18. The system as claimed in claim 16 further comprising:
a further stack component over the stack component; and
conductive wires connected to the further stack component at each end of the further stack component.

19. The system as claimed in claim 16 further comprising:
a further stack component over the stack component; and
a conductive wire connected only at one end to the further stack component.

20. The system as claimed in claim 16 further comprising a further stack component over the stack component, the further stack component of a different thickness from the stack component.

* * * * *